United States Patent [19]

Wen et al.

[11] Patent Number: 5,352,904

[45] Date of Patent: * Oct. 4, 1994

[54] MULTIPLE QUANTUM WELL SUPERLATTICE INFRARED DETECTOR WITH LOW DARK CURRENT AND HIGH QUANTUM EFFICIENCY

[75] Inventors: Cheng P. Wen, Mission Viejo; Chan-Shin Wu, Torrance, both of Calif.

[73] Assignee: Hughes Aircraft Company, Los Angeles, Calif.

[*] Notice: The portion of the term of this patent subsequent to Dec. 31, 2008 has been disclaimed.

[21] Appl. No.: 792,502

[22] Filed: Nov. 21, 1991

Related U.S. Application Data

[63] Continuation-in-part of Ser. No. 457,613, Dec. 27, 1989, Pat. No. 5,077,593.

[51] Int. Cl.⁵ .................... H01L 27/14; H01L 31/00
[52] U.S. Cl. ........................ 257/21; 257/23; 257/29; 257/184
[58] Field of Search ............. 257/21, 14, 15, 23, 257/29, 184, 431

[56] References Cited

U.S. PATENT DOCUMENTS 4,982,255  1/1991  Tomita ............................ 357/30
5,077,593  12/1991  Sato et al. ......................... 357/4

OTHER PUBLICATIONS

Yokoyama, N., et al. "A New Functional Resonant-Tunneling Hot Electron Transistor" Jap. Jour. of Appl. Phys. Nov. 1985 pp. L853–L854.

Primary Examiner—Sara W. Crane
Attorney, Agent, or Firm—W. C. Schubert; W. K. Denson-Low

[57] ABSTRACT

A multiple quantum well (MQW) radiation sensor eliminates tunneling current from the photoactivated current that provides an indication of incident radiation, and yet preserves a substantial bias voltage across the superlattice, by fabricating an intermediate contact layer between the superlattice and a tunneling blocking layer. Using the intermediate contact layer to apply a bias voltage across the superlattice but not the blocking layer, the photoexcited current flow through the intermediate contact and blocking layers is taken as an indication of the incident radiation. The width of the intermediate contact layer and the barrier energy height of the blocking layer relative to that of the superlattice barrier layers are selected to enable a substantial photoexcited current flow across the blocking layer. The thickness of the intermediate contact layer is preferably not more than about 1 photoexcited charge carrier mean-free path length, while the blocking layer's barrier energy height is preferably at least about 1 phonon energy level below that of the superlattice barrier layers.

15 Claims, 2 Drawing Sheets

MULTIPLE QUANTUM WELL SUPERLATTICE INFRARED DETECTOR WITH LOW DARK CURRENT AND HIGH QUANTUM EFFICIENCY

This Application is a continuation-in-part of U.S. patent application Ser. No. 457,613, filed Dec. 27, 1989, now U.S. Pat. No. 5,077,593 issued Dec. 31, 1991, inventors Robert N. Sato, Chan Shin Wu and Chang P. Wen and assigned to Hughes Aircraft Company.

BACKGROUND OF THE INVENTION

1. Field of the Invention

This invention relates to the detection of electromagnetic radiation with a multiple quantum well (MQW) superlattice structure, and more particularly to the sensing of long wavelength infrared radiation (LWIR) with an MQW superlattice that is subject to a significant dark current level.

2. Description of the Related Art

MQW superlattice LWIR detectors made of heterojunction materials, such as $GaAs/Ga_xAl_{1-x}As$, provide excellent design flexibility for spectral response. Because of the large bandgap of the semiconductive materials employed and the ultra-thin (typically less than 1 micron) structure required, the detector offers potentially superior radiation hard characteristics as compared with narrow bandgap HgCdTe-based or thicker (about 20 microns) extrinsic silicon devices. The detection of LWIR with an MQW sensor has been reported in several publications, such as Levine et al., "Bound-to-Extended State Absorption GaAs Superlattice Transport Infrared Detectors", *J. Applied Physics Letters*, Vol. 64, No. 3, 1 Aug. 1988, pages 1591-1593; Levine et al., "Broadband 8-12 $\mu$m High-Sensitivity GaAs Quantum Well Infrared Photodetector", Applied Physics Letters, Vol, 54, No. 26, 26 Jun. 1989, pages 2704-2706; Hasnain et al., "GaAs/AlGaAs Multiquantum Well Infrared Detector Arrays Using Etched Gratings", Applied Physics Letters, Vol. 54, No. 25, 19 Jun. 1989, pages 2515-2517; Levine et al., "High-Detectivity $D^* = 1.0 \times 10^{10} cm\sqrt{Hz}/W$ GaAs/AlGaAs Multiquantum Well $\lambda = 8.3$ $\mu$m Infrared Detector", *Applied Physics Letters*, Vol. 53, No. 4, 25 Jul. 1988,, pages 296-298.

The principal of operation for an MQW superlattice IR detector is illustrated in FIG. 1. The basic device consists of a periodic heterostructure of GaAs quantum wells 2 and AlGaAs barrier layers 4. The GaAs quantum well layers are doped with an n-type dopant, such as silicon, to provide electrons in the ground states of the wells for intersubband detection.

The thickness of each quantum well layer 2 is sufficiently small, preferably about 20-60 Angstroms and most preferably about 40 Angstroms, that quantum effects are significant. The thickness of each barrier layer 4 is generally about 80-300 Angstroms, and most preferably about 140 Angstroms. The superlattice period is thus preferably about 180 Angstroms. To maximize the device's quantum efficiency, it is desirable to provide many quantum well layers 2. Photon absorption occurs in the quantum well layers, and quantum efficiency is thus a function of the number of such layers. Although a smaller number of periods is shown in FIG. 1, it is generally preferred that the superlattice comprise about a 20-30 period structure. GaAs quantum well layers 2 are heavily doped n-type with a donor impurity such as Ge, S, Si, Sn, Te or Se. A particularly preferred dopant is Si at a concentration of about $1 \times 10^{18} - 5 \times 10^{18} cm^{-3}$, and most preferably about $5 \times 10^{18} cm^{-3}$. Lattice match and thermal coefficient considerations, impurity concentrations and fabrication techniques are known in the art.

Although a GaAs/AlGaAs superlattice is preferred, other materials may also be used. For example, it may be desirable to use materials such as InGaAs/InAlAs on InP, SiGe on Si, or HgCdTe. In general, superlattices fabricated from III-V, IV-IV and II-VI semiconductor materials are suitable. The MQW superlattice detectors are particularly suited for the detection of LWIR, but the sensors in general are applicable to the detection of radiation and other wavelength regimes, and no limitation to LWIR for the present invention is intended.

The potential energy barrier height $E_b$ of the barrier layers 4 is about 160 meV above the potential energy barrier height $E_w$ of the quantum wells 2 for GaAs/AlGaAs. For LWIR with peak detection of about 12 microns, the energy gap between the bound state and the excited state for electrons in the quantum wells is about 100 meV, with the first electron excited state in the quantum wells lying above the conduction band edge of the barrier layers.

Incident infrared photons excite electrons from the quantized baseband 6 of the wells to extended excited states in continuous conduction subband 8, which has an energy level greater than the conduction band floor for barrier layers 4. These excited electrons are then accelerated towards a collector by an electric field created by an externally applied bias voltage. Under normal sensor operating conditions, the bias voltage causes the mean-free path of electrons in the subband 8 to be sufficiently large for the electrons to travel under the applied field through the superlattice, producing a photocurrent 10 that is measured as an indication of the magnitude of incident radiation.

The sensitivity of an MQW superlattice infrared detector can be severely limited by high levels of dark current. This current consists primarily of electrons which tunnel through the intervening barrier layers 4 between the ground states of adjacent quantum wells 2, and is indicated by arrows 12. The tunneling current can be reduced by in creasing the widths of the barrier layers 4. However, any such increase in the barrier layer width reduces the device's radiation hardness, which is inversely related to its thickness.

An improvement upon the described detector, illustrated in FIG. 2, is disclosed in pending U.S. patent application Ser. No. 07/457,613, filed Dec. 27, 1989 by Sato et al., "Dark Current-Free Multiquantum Well Superlattice Infrared Detector", and assigned to Hughes Aircraft Company, the assignee of the present invention. Under this approach the barrier layers 4 are kept thin, but a thicker (generally about 800-3,000 Angstroms) tunneling current blocking layer 14 is provided at the end of the superlattice in the path of the tunneling electrons. An electron emitter contact layer 16 is formed at the far end of the superlattice from the blocking layer, while an electron collector layer 18 is formed on the opposite side of the blocking layer from the superlattice. The blocking layer 14, which is preferably formed from the same material as the barrier layers 4, eliminates most of the tunneling current component of the photodetector's dark current. This in turn allows the individual barrier layers 4 to be made thinner, thus enhancing the detector's quantum efficiency and increasing its radiation hardness.

While the addition of the blocking layer 14 produces an extremely low dark current and desirable photo-voltage operating characteristics, the device as thus modified is not readily adaptable to receiving an external bias voltage. This is because the blocking layer 14 is a high resistance region compared to the MQW superlattice, and most of the bias voltage drop is diverted from the superlattice to the blocking layer. The performance improvement that otherwise would be available by applying a bias voltage across the superlattice is thus prevented.

SUMMARY OF THE INVENTION

The present invention seeks to provide an MQW superlattice detector that retains a blocking layer to inhibit the flow of tunneling current, and yet allows a substantial bias voltage to be applied across the superlattice to improve its performance.

This goal is achieved by inserting a contact for an external bias voltage between the superlattice and the blocking layer, making the contact layer thin enough to avoid a large scale absorption of photoexcited charge carriers that flow from the superlattice under the influence of an applied bias voltage, and reducing the barrier energy height of the blocking layer to enable a substantial flow of the photoexcited charge carriers across the blocking layer. The full bias voltage can thus be applied directly to the superlattice without diminution by the blocking layer, while the blocking layer is still included in the photoexcited current circuit and thus continues to perform its function of blocking tunneling current.

In a preferred embodiment the thickness of the contact layer is not more than about 1 mean-free path length of the photoexcited charge carriers, while the blocking layer's barrier energy height is at least about 1 phonon energy level below the barrier energy heights of the superlattice barrier layers. For a GaAs/AlGaAs superlattice the inserted contact layer is preferably GaAs about 1,000–1,500 Angstroms thick, while the blocking layer is AlGaAs with a barrier energy height about 35 meV below that of the superlattice barrier layers.

In addition to the primary bias voltage across the superlattice, a supplemental bias voltage may be applied across the blocking layer to enhance the flow of photoexcited charge carriers there.

These and other features and advantages of the invention will be apparent to those skilled in the art from the following detailed description, taken together with the accompanying drawings, in which:

DETAILED DESCRIPTION OF THE INVENTION

Figure 1:
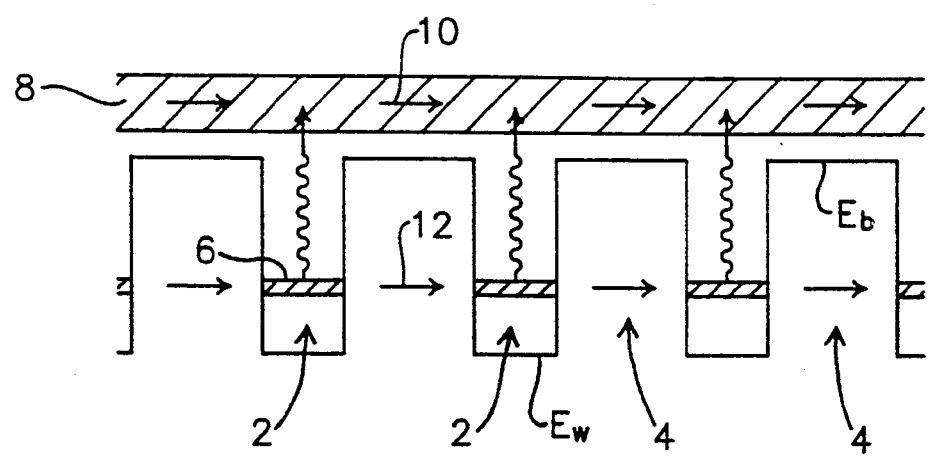
FIG. 1 is an energy diagram, discussed above, of a prior MQW superlattice photodetector.
Figure 2:
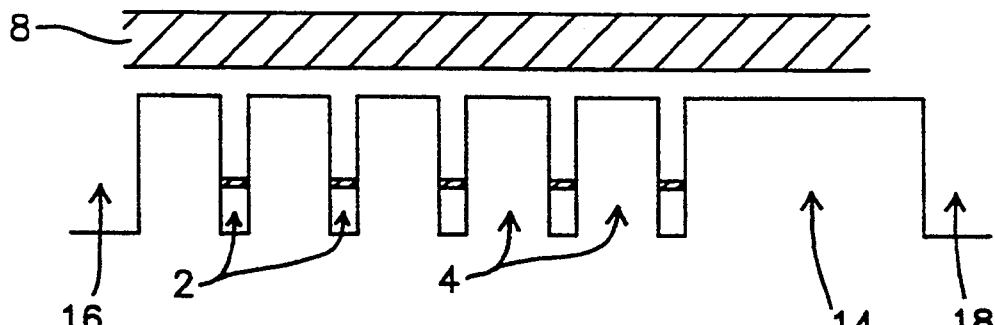
FIG. 2 is an energy diagram, discussed above, of a prior MQW superlattice photodetector with a blocking layer for tunneling current.
Figure 3:
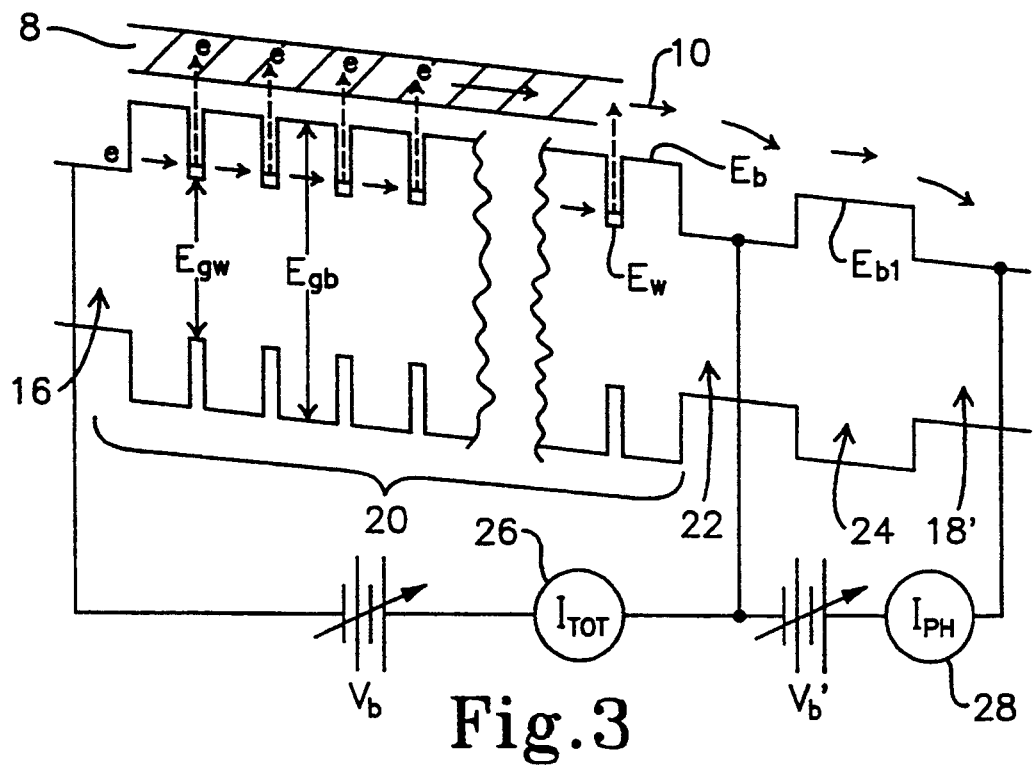
FIG. 3 is a combined energy and schematic diagram showing a preferred embodiment of the present invention.

A preferred embodiment of the invention is illustrated in FIG. 3. An MQW superlattice and left side contact layer, collectively identified by numeral 20, are similar to the corresponding structure in the prior devices of FIGS. 1 and 2. The energy bandgaps $E_{gw}$ and $E_{gb}$, respectively for the quantum wells and the intermediate barrier layers, are indicated. However, instead of forming a blocking layer on the right hand side of the superlattice, an intermediate contact layer 22 is inserted at this location, while a modified blocking layer 24 is fabricated immediately to the right of the inserted contact layer 22, followed by an outer contact layer 18'. With a GaAs/AlGaAs superlattice, each of the contact layers 16, 18' and 22 is preferably formed from heavily n-doped GaAs.

A bias voltage source $V_b$ of up to a few volts is connected across the left and intermediate contact layers 16 and 22, establishing a bias voltage across the superlattice that sweeps photoexcited electrons in a current flow 10 from the superlattice into the intermediate contact 22. Since the superlattice barrier layers are thin, tunneling current 12 can also flow into the intermediate contact 22. The total current flow, including both photoexcited and tunneling currents, can be detected by an ammeter 26 connected across the contact layers 16 and 22.

The thermal energy of the solid material used for the blocking layer is contained in certain combinations of particle vibrations that are equivalent to standing elastic waves, and are referred to as normal modes. Each normal mode contains a number of discrete quanta of energy called phonons. Phonons are considered only as particles, each having an energy, a momentum and a velocity. In a manner analogous to the energy levels of electrons in a solid, phonons can have only certain discrete allowed energies; the phonon energy for AlGaAs is about 35 meV. As explained below, the blocking layer 24 is selected to have an energy barrier height $E_{bl}$ that is preferably just more than 1 phonon energy level below that of the barrier energy heights $E_b$ in the superlattice.

The energy barrier height $E_{bl}$ for the blocking layer is designed so that it is low enough for the majority of electrons that pass through the intermediate contact layer 22 to continue on through the blocking layer for collection by outer contact 18', and yet still high enough to effectively block tunneling current from the superlattice. To this end the blocking layer's energy barrier $E_{bl}$ is coordinated with the width of the intermediate contact layer 22; increasing the width of the intermediate contact layer increases the energy which it absorbs from photoexcited electrons, thus forcing a reduction in $E_{bl}$ so that the electrons can still get through the blocking layer. The intermediate contact layer 22 is preferably about 1 electron mean-free path length wide; for GaAs the electron mean-free path is about 1,500 Angstroms, and the intermediate contact layer is preferably about 1,000–1,500 Angstroms wide. With this thickness for the intermediate contact layer, photoexcited electrons traversing the contact layer will on average suffer a loss of 1 phonon energy. Thus, by making the energy barrier height of the blocking layer 24 slightly more than 1 phonon energy level (35 meV for GaAs) below the barrier energy heights in the superlattice, most of the photoexcited electrons will still reach the collector contact 18'. However, since the reduced energy barrier height for the blocking layer is still above the energy level of tunneling electrons, there will be a very low probability of tunneling electrons getting through the blocking layer. The new sensor design thus provides for a separation of tunneling and photo-induced currents, resulting in a high quantum efficiency with a low dark current operation.

To produce the desired differential in energy barrier heights between the superlattice barrier layers and the blocking layer 22, each are implemented with $Al_x Ga_{1-x}As$, with a different value of x. In a preferred implementation x=0.215 for the superlattice barrier layers, and 0.167 for the blocking layer.

The current through the blocking layer 24 corresponds to the current from the superlattice, and thus provides an indication of the level of incident radiation to which the detector is sensitive. This current is sensed by connecting an ammeter 28 across the electron collector contact 18' and the intermediate contact layer 22. If it is desired to boost the flow of current across the blocking layer, a supplemental bias voltage source $V_b'$, producing a voltage level of up to a few volts, can also be connected across these contacts. The supplemental source $V_b'$ can be used if there is excessive recombination of electrons between the superlattice and the electron collector contact 18', although normally it is desirable to operate with only a single voltage supply.

Figure 4:
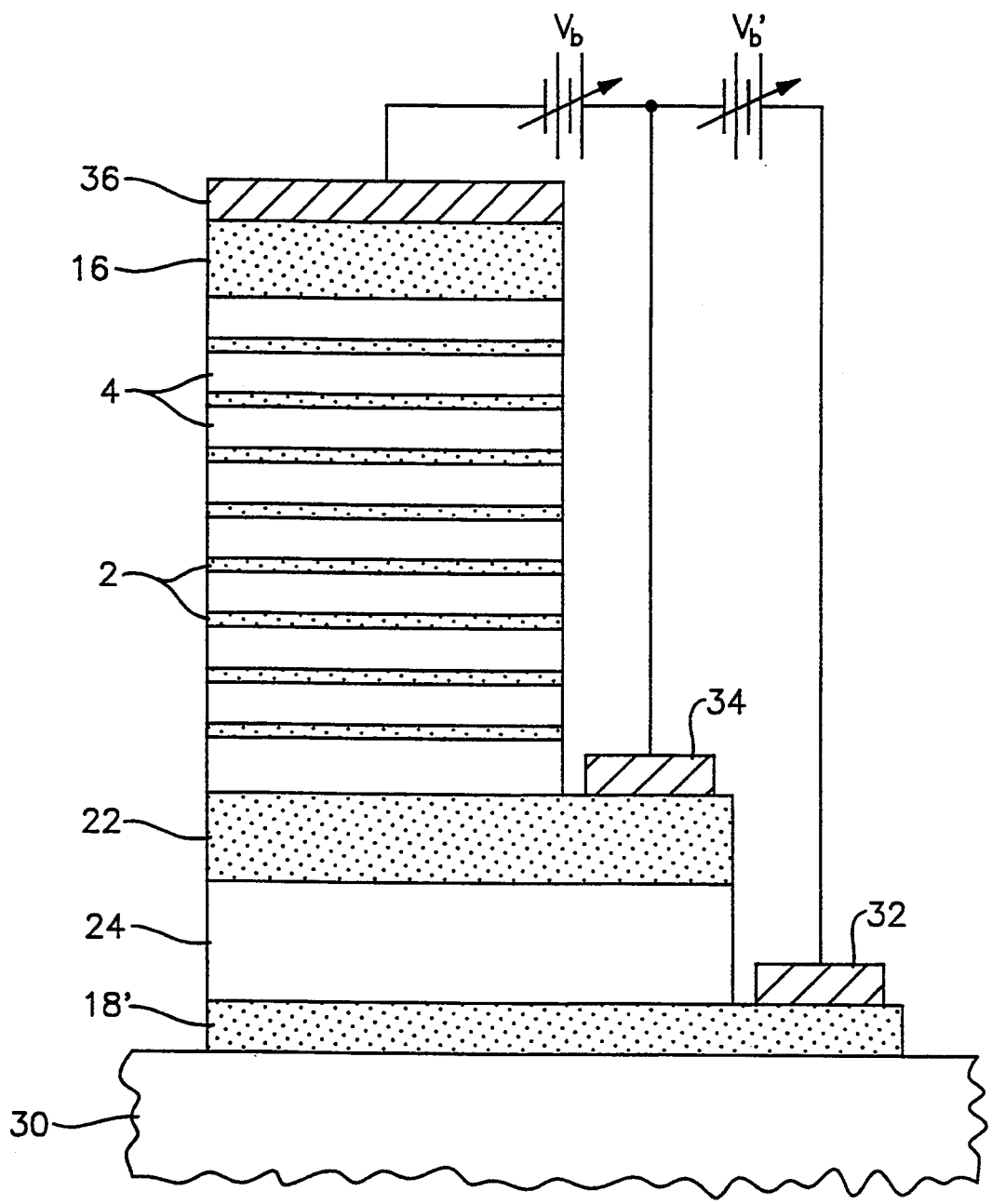
FIG. 4 is a sectional view, not to Scale, of one structural implementation of the invention.

A sectional view of a physical implementation of the invention is provided in FIG. 4. The detector is fabricated upon a substrate 30 by standard epitaxial growth methods. In general, an array of similar detectors will be formed upon the same substrate. The electron collector contact 18' is grown immediately upon the substrate 30, with the remainder of the detector formed above it. The detector is stepped back above electron collector contact 18' and again above intermediate contact layer 22 to provide room for the deposition of ohmic contacts 32 and 34, respectively; a third ohmic contact 36 is deposited upon the uppermost contact layer 16. Connections to the voltage bias source $V_b$ and to the optional supplemental bias source $V_b'$, as well as to the ammeters (not shown), are made from the ohmic contacts.

While particular embodiments of the invention have been shown and described, numerous variations and alternate embodiments will occur to those skilled in the art. For example, while the invention has been described in terms of an MQW with n-doped quantum wells, it is also applicable to MQW sensors with p-doped quantum wells. With p-doped devices holes constitute the majority charge carriers, and a hole current is swept across the intermediate contact layer 22 and blocking layer 24 as an indication of the incident radiation. The principles of the invention are also applicable to MQW superlattice detectors that are sensitive to radiation outside the LWIR region. Accordingly, it is in-tended that the invention be limited only in terms of the appended claims.

I claim:

1. A multiple quantum well (MQW) radiation detector, comprising:
    an MQW superlattice with alternating quantum well and barrier layers,
    first and second contact layers on opposite sides of said MQW superlattice for applying a bias voltage across said superlattice, said first contact layer being sufficiently thin to avoid large scale absorption of photoexcited charge carriers flowing from the superlattice under the influence of an applied bias voltage across said contact layers, and
    a tunneling current blocking layer on the opposite side of said first contact layer from said superlattice, said blocking layer having a thickness great enough to substantially block the flow of tunneling current from said superlattice, and a barrier energy height sufficiently less than that of said superlattice barrier layers to enable a substantial flow of said photoexcited charge carriers across said blocking layer.

2. The MQW radiation detector of claim 1, wherein the thickness of said first contact layer is not more than about one photoexcited charge carrier mean-free path length.

3. The MWQ radiation detector of claim 2, said MQW superlattice comprising GaAs quantum wells and AlGaAs barrier layers, and said first contact layer comprising GaAs about 1,000–1,500 Angstroms thick.

4. The MQW radiation detector of claim 1, wherein the barrier energy height of said blocking layer is at least about one phonon energy level below the barrier energy heights of said MQW barrier layers.

5. The MQW radiation detector of claim 4, said MQW superlattice comprising GaAs quantum wells and AlGaAs barrier layers, and said blocking layer comprising AlGaAs with a barrier energy height about 35 meV below the barrier energy heights of said MQW barrier layers.

6. The MQW radiation detector of claim 1, wherein the thickness of said first contact layer is not more than about one photoexcited charge carrier mean free path length, and the barrier energy height of said blocking layer is at least about one phonon energy level below the barrier energy heights of said MQW barrier layers.

7. A multiple quantum well (MQW) radiation detection system, comprising:
    an MQW superlattice with alternating quantum well and barrier layers, said superlattice being sensitive to radiation within a predetermined waveband,
    first and second contact layers on opposite sides of said superlattice, said first contact layer being sufficiently thin to avoid large scale absorption of photoexcited charge carriers flowing from the superlattice under the influence of an applied bias voltage across said contact layers,
    a tunneling current blocking layer on the opposite side of said first contact layer from said superlattice, said blocking layer having a thickness great enough to substantially block the flow of tunneling current from said superlattice, and a barrier energy height sufficiently less than that of said superlattice barrier layers to enable a substantial flow of said photoexcited charge carriers through said blocking layer,
    a third contact layer for collecting said photoexcited charge carriers that have flowed across said blocking layer,
    means for applying a primary bias voltage across said first and second contact layers, and
    means for sensing the flow of current across said blocking layer as an indication of the magnitude of radiation within said waveband that is incident upon said MQW superlattice.

8. The system of claim 7, further comprising means for applying a supplemental bias voltage across said second and third contact layers to reinforce the flow of said photoexcited charge carriers across said blocking layer.

9. The system of claim 7, wherein the thickness of said first contact layer is not more than about one photoexcited charge carrier mean-free path length.

10. The system of claim 7, wherein the barrier energy height of said blocking layer is at least about one phonon energy level below the barrier energy heights of said MQW barrier layers.

11. The system of claim 7, wherein the thickness of said first contact layer is not more than about one photoexcited charge carrier mean-free path length, and the barrier energy height of said blocking layer is at least about one phonon energy level below the barrier energy heights of said MQW barrier layers.

12. A multiple quantum well (MQW) radiation detector, comprising:
 an MQW superlattice with alternating quantum well and barrier layers, radiation within a predetermined wave-band exciting charge carriers from said superlattice into a conductive state,
 a tunneling current blocking layer on one side of said superlattice, said blocking layer having a thickness great enough to substantially block the flow of tunneling current from said superlattice, and
 means for applying a bias voltage across said superlattice independent of said blocking layer, sufficient to establish a flow of photoexcited charge carriers from said superlattice across said barrier layer.

13. The MQW radiation detector of claim 12, said means for applying a bias voltage across said superlattice comprising a first contact layer between said superlattice and said blocking layer, said first contact layer being sufficiently thin to avoid large scale absorption of said photoexcited charge carriers flowing from said superlattice to said blocking layer, and a second contact layer on the opposite side of said superlattice from said first contact layer.

14. The MQW radiation detector of claim 13, said blocking having a barrier energy height sufficiently less than that of said MQW barrier layers to enable a substantial flow of said photoexcited charge carriers from said superlattice through said barrier layer.

15. The MQW radiation detector of claim 14, wherein the thickness of said first contact layer is not more than about one photoexcited charge carrier mean free path length, and the barrier energy height of said blocking layer is at least about one phonon energy level below the barrier energy heights of said MQW barrier layers.

* * * * *